(12) United States Patent
Forrest et al.

(10) Patent No.: US 7,744,957 B2
(45) Date of Patent: Jun. 29, 2010

(54) METHOD AND APPARATUS FOR DEPOSITING MATERIAL

(75) Inventors: Stephen R. Forrest, Ann Arbor, MI (US); Max Shtein, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/690,704

(22) Filed: Oct. 23, 2003

(65) Prior Publication Data

US 2005/0087131 A1 Apr. 28, 2005

(51) Int. Cl.
*C23C 16/00* (2006.01)
*B05D 5/06* (2006.01)

(52) U.S. Cl. .................. 427/249.1; 427/69; 427/70; 427/256

(58) Field of Classification Search .......... 427/421, 427/248.1, 294, 427/4, 58
See application file for complete search history.

(56) References Cited

U.S. PATENT DOCUMENTS

| | | | | |
|---|---|---|---|---|
| 4,325,986 | A | * | 4/1982 | Baron et al. ............ 438/62 |
| 4,788,082 | A | * | 11/1988 | Schmitt ............ 427/248.1 |
| 4,869,936 | A | * | 9/1989 | Moskowitz et al. ....... 427/455 |
| 5,256,205 | A | | 10/1993 | Schmitt, III et al. |
| 5,356,673 | A | | 10/1994 | Schmitt et al. |

(Continued)

FOREIGN PATENT DOCUMENTS

EP 0 173 715 4/1992

(Continued)

OTHER PUBLICATIONS

Kirk-Othmer. "Vacuum Technology". Encyclopedia of Chemical Technology. 4th Edition. vol. 24. 1997. pp. 750-753.*

(Continued)

*Primary Examiner*—David Turocy
(74) *Attorney, Agent, or Firm*—Townsend and Townsend and Crew LLP

(57) ABSTRACT

A method of depositing organic material is provided. A carrier gas carrying an organic material is ejected from a nozzle at a flow velocity that is at least 10% of the thermal velocity of the carrier gas, such that the organic material is deposited onto a substrate. In some embodiments, the dynamic pressure in a region between the nozzle and the substrate surrounding the carrier gas is at least 1 Torr, and more preferably 10 Torr, during the ejection. In some embodiments, a guard flow is provided around the carrier gas. In some embodiments, the background pressure is at least about 10e-3 Torr, more preferably about 0.1 Torr, more preferably about 1 Torr, more preferably about 10 Torr, more preferably about 100 Torr, and most preferably about 760 Torr. A device is also provided. The device includes a nozzle, which further includes a nozzle tube having a first exhaust aperture and a first gas inlet; and a jacket surrounding the nozzle tube, the jacket having a second exhaust aperture and a second gas inlet. The second exhaust aperture completely surrounds the first tube aperture. A carrier gas source and an organic source vessel may be connected to the first gas inlet. A guard flow gas source may be connected to the second gas inlet. The device may include an array of such nozzles.

27 Claims, 15 Drawing Sheets

U.S. PATENT DOCUMENTS

| | | | |
|---|---|---|---|
| 5,650,197 | A | 7/1997 | Halpern |
| 5,707,745 | A | 1/1998 | Forrest et al. |
| 5,709,906 | A * | 1/1998 | Bickford et al. ............. 427/306 |
| 5,720,821 | A | 2/1998 | Halpern |
| 5,759,634 | A | 6/1998 | Zang |
| 6,048,630 | A | 4/2000 | Burrows et al. |
| 6,066,357 | A | 5/2000 | Tang et al. |
| 6,165,554 | A | 12/2000 | Halpern et al. |
| 6,214,631 | B1 | 4/2001 | Burrows et al. |
| 6,337,102 | B1 | 1/2002 | Forrest et al. |
| 6,468,605 | B2 * | 10/2002 | Shah et al. .................. 427/600 |
| 6,596,443 | B2 | 7/2003 | Weaver et al. |
| 6,716,656 | B2 | 4/2004 | Shtein et al. |

FOREIGN PATENT DOCUMENTS

| | | |
|---|---|---|
| GB | 2 336 553 | 10/1999 |
| WO | WO 01/61071 | 8/2001 |
| WO | WO 02/087787 | 11/2002 |
| WO | WO 03/020999 | 3/2003 |
| WO | WO 03/020999 A1 * | 3/2003 |

OTHER PUBLICATIONS

Sitckney et al. "Angular Distribution of Flow from Orifices and Tubes at High Knudsen Numbers" A Journal of Vacuum Science and Tecnology, 1967. vol. 4. p. 10-17.*

Shtein et al., "Micropatterning of small molecular weight organic semiconductor thin films using organic vapor phase deposition", J. Appl. Phys., vol. 93, No. 7, pp. 4005-4016, Apr. 1, 2003.*

Shtein, et al., "Micron scale patterning of organic thin films via organic vapor phase deposition", Presentation Outline from the Mat. Res. Soc. Ann. Meeting 2001, Boston.*

A.K. Rebrov, "Free Jets in Vacuum technologies", J. Vac. Sci. Technol., A 19(4), pp. 1679-1687, Jul./Aug. 2001.

J. Fernandez de la Mora, "Surface impact of seeded jets at relatively large background densities", J. Chem. Phys, 82 (7), pp. 3453-3464, Apr. 1, 1985.

J. Fernandez de la Mora et al., "Aerodynamic focusing of heavy molecules in seeded supersonic jets", J. Chem. Phys, 91 (4), pp. 2603-2615, Aug. 15, 1989.

A.V. Vasenkov et al., "Flow-field properties under deposition of films from low-density jets", J. Appl. Phys., 77(9), pp. 4757-4764, May 1, 1995.

A.V. Vasenkov, et al., "Monte Carlo simulation of an amorphous hydrogenated silicon film deposition from a gas jet activated by an electron beam", Journal of Applied Physics, vol. 83, No. 7, pp. 3926-3928, Apr. 1, 1998.

Karl-Heinz Muller, "Role of Incident Kinetic Energy of Adatoms in Thin Film Growth", Surface Science vol. 184 (1987) pp. L375-L382.

M. Lebedev et al., "Simple self-selective method of velocity measurement for particles in impact-based deposition", J. Vac. Sci. Technol., A 18(2), pp. 563-566, Mar./Apr. 2000.

B.L. Halpern et al., "Multiple Jets and moving substrates: Jet Vapor Deposition of multicomponent thin films", J. Vac. Sci. Technol., A 12 (4), pp. 1623-1627, Jul./Aug. 1994.

D. Lubben, et al., "Growth and doping of Si layers by molecular-jet chemical vapor deposition: Device fabrication", Appl. Phys. Lett., 71(19), pp. 2812-2814, Nov. 10, 1997.

B.L. Halpern et al., "Gas jet deposition of thin films", Applied Surface Science 48/49, pp. 19-26, 1991.

D. Eres, "High-speed epitaxy using supersonic molecular jets", Mat. Res. Soc. Symp. Proc., vol. 201, 1991.

G. Eres, "Application of Supersonic Molecular Jets in Semiconductor Thin Film Growth", Critical reviews in solid state and materials sciences, vol. 23, Issue 4, pp. 275-322, 1998.

Zhang et al., "Jet Vapor Deposition of Organic Guest-Inorganic Host Thin Films for Optical and Electronic Applications", Journal of Electronic Materials, vol. 23, No 11, pp. 1239-1244, Nov. 1994.

Shtein et al., "Direct mask-free patterning of molecular organic semiconductors using organic vapor jet printing", Journal of Applied Physics, vol. 96, No. 8, pp. 4500-4507, Oct. 15, 2004.

ASTM, Compilation of ASTM Standard Definitions, Eighth Edition, p. 380 (1994).

Baldo, et al., "Low pressure organic vapor phase deposition of small molecular weight organic light emitting device structures", *Appl. Phys. Lett.* 71(21), pp. 3033-3035 (Nov. 24, 1997).

Baldo, et al., "Organic Vapor Phase Deposition", *Adv. Mater.* 10, No. 18, pp. 1505-1514 (1998.

Bird, et al., Transport Phenomena, New York, John Wiley & Sons, Inc., pp. 508-513 (1960).

Burrows, et al., "Organic Vapor Phase Deposition: a new method for the growth of organic thin films with large optical non-linearities", *J. Cryst. Growth* 156, pp. 91-98 (1995).

U.S. Appl. No. 10/233,470, filed Sep. 4, 2002, Shtein et al.

Forrest et al., "Intense Second Harmonic Generation and Long-Range Structural Ordering in Thin Films of Organic Salt Grown by Organic Vapor Phase Deposition," Appl. Phys. Lett., vol. 68, pp. 1326-1328 (1996).

Forrest, "Ultrathin Organic films grown by organic molecular beam deposition and related techniques", Chem. Rev. vol. 97, No. 6, pp. 1793-1896 (Sep./Oct. 1997).

Krumdieck, "Kinetic Model of Low Pressure Film Deposition From Single Precursor Vapor in a Well-Mixed , Cold-Wall Reactor", Acta mater. 49, 2001, pp. 583-588.

Olsen, "Vapour-phase Epitaxy of GaInAsP", *GaInAsP Alloy Semiconductors*, edited by T. P. Pearsall (Wiley, New York, 1982), pp. 11-41.

Parker, ed., McGraw-Hill Dictionary of Scientific and Technical Terms, Fifth Edition, p. 1516 (1994.

Shtein et al., "Micropatterning of small molecular weight organic semiconductor thin films using organic vapor phase deposition", J. Appl. Phys., vol. 93, No. 7, pp. 4005-4016, Apr. 1, 2003.

Shtein et al., "Effects of Film Morphology and Gate Dielectric Surface Preparation on the Electrical Characteristics of Organic Vapor Phase Deposited Pentacene Thin-Film Transistors," Appl. Phys. Lett., vol. 81, pp. 268-270 (2002).

Shtein, et al., "Micron scale patterning of organic thin films via organic vapor phase deposition", Presentation Outline from the Mat. Res. Soc. Ann. Meeting 2001, Boston.

Shtein, et al., "Material transport regimes and mechanisms for growth of molecular organic thin films using low-pressure organic vapor phase deposition", *J. Appl. Phys.* 89:2, pp. 1470-1476 (Jan. 15, 2001).

Stringfellow, *Organometallic Vapor-Phase Epitaxy: Theory and Practice*, pp. 55-283 (Academic, London, 1989).

Supplementary European Search Report from EP 0 277 0461 dated Jun. 12, 2007.

Vaeth, et al., "Chemical vapor deposition of poly (p-phenylene vinylene) based light emitting diodes with low turn-on voltages", *Appl. Phys. Lett.* 71 (15), pp. 2091-2093 (Oct. 13, 1997).

Wolf and R. N. Tauber, *Silicon Processing for the VLSI Era, VolumeI: Process Technology*, pp. 73-123 (Lattice, 1986).

Zhang et al., Jet Vapor Deposition of Nanostructure Composite Materials, Materials Res. Soc. Symp. Proc., Mater. Res. Soc. Symposium Proc. 1193, 286, pp. 385-389.

* cited by examiner

METHOD AND APPARATUS FOR DEPOSITING MATERIAL

GOVERNMENT RIGHTS

This invention was made with Government support under Contract No. DAAD19-02-2-00198 awarded by the Army Research Lab. The government has certain rights in this invention.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to a method and apparatus for depositing material.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Organic optoelectronic devices such as thin film transistors (TFTs), light emitting diodes (LEDs) and photovoltaic (PV) cells, have gained considerable attention of researchers during the past decade. Organic semiconductors can be deposited on a variety of substrates, which potentially simplifies and lowers fabrication costs when compared to inorganic semiconductors. However, the unique processing requirements of organic semiconductors can also limit their application. For example, light emitting devices and PV cells typically consist of thin (<100 nm) films of either conjugated polymers or monomers, sandwiched between conducting electrodes. For full-color displays and multi-transistor circuits, the active organic layers themselves must also be laterally patterned. However, the organic layers are typically too fragile to withstand conventional semiconductor processing methods such as photolithography, plasma processing, or reactive ion etching. Many fabrication and patterning techniques have therefore been developed to address these unique requirements, emphasizing primarily the ease and low cost of processing.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

Early methods of patterning organic materials involved the deposition of organic materials through a mask. The organic materials may be deposited through an "integrated" mask which is attached to the substrate on which the device is being fabricated, as disclosed in U.S. Pat. No. 6,596,443, issued on Jul. 22, 2003, which is incorporated by reference in its entirety. Or, the organic materials may be deposited through a shadow mask that is not integrally connected to the substrate, as disclosed in U.S. Pat. No. 6,214,631, issued on Apr. 10, 2001, which is incorporated by reference in its entirety. However, the resolution that may be achieved with such masks is limited due to a number of factors, including the resolution to which a mask may be reliably fabricated, the buildup of organic material on the mask, and the diffusion of organic material in between the mask and the substrate over which it is being deposited.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

SUMMARY OF THE INVENTION

A method of depositing organic material is provided. A carrier gas carrying an organic material is ejected from a nozzle at a flow velocity that is at least 10% of the thermal velocity of the carrier gas, such that the organic material is deposited onto a substrate. In some embodiments, the dynamic pressure in a region between the nozzle and the substrate surrounding the carrier gas is at least 1 Torr, and more preferably 10 Torr, during the ejection. In some embodiments, a guard flow is provided around the carrier gas. In some embodiments, the background pressure is at least about 10e-3 Torr, more preferably about 0.1 Torr, more preferably about 1 Torr, more preferably about 10 Torr, more preferably about 100 Torr, and most preferably about 760 Torr. A device is also provided. The device includes a nozzle, which further includes a nozzle tube having a first exhaust aperture and a first gas inlet; and a jacket surrounding the nozzle tube, the jacket having a second exhaust aperture and a second gas inlet. The second exhaust aperture completely surrounds the first tube aperture. A carrier gas source and an organic source vessel may be connected to the first gas inlet. A guard flow gas source may be connected to the second gas inlet. The device may include an array of such nozzles.

DETAILED DESCRIPTION

Figure 1:
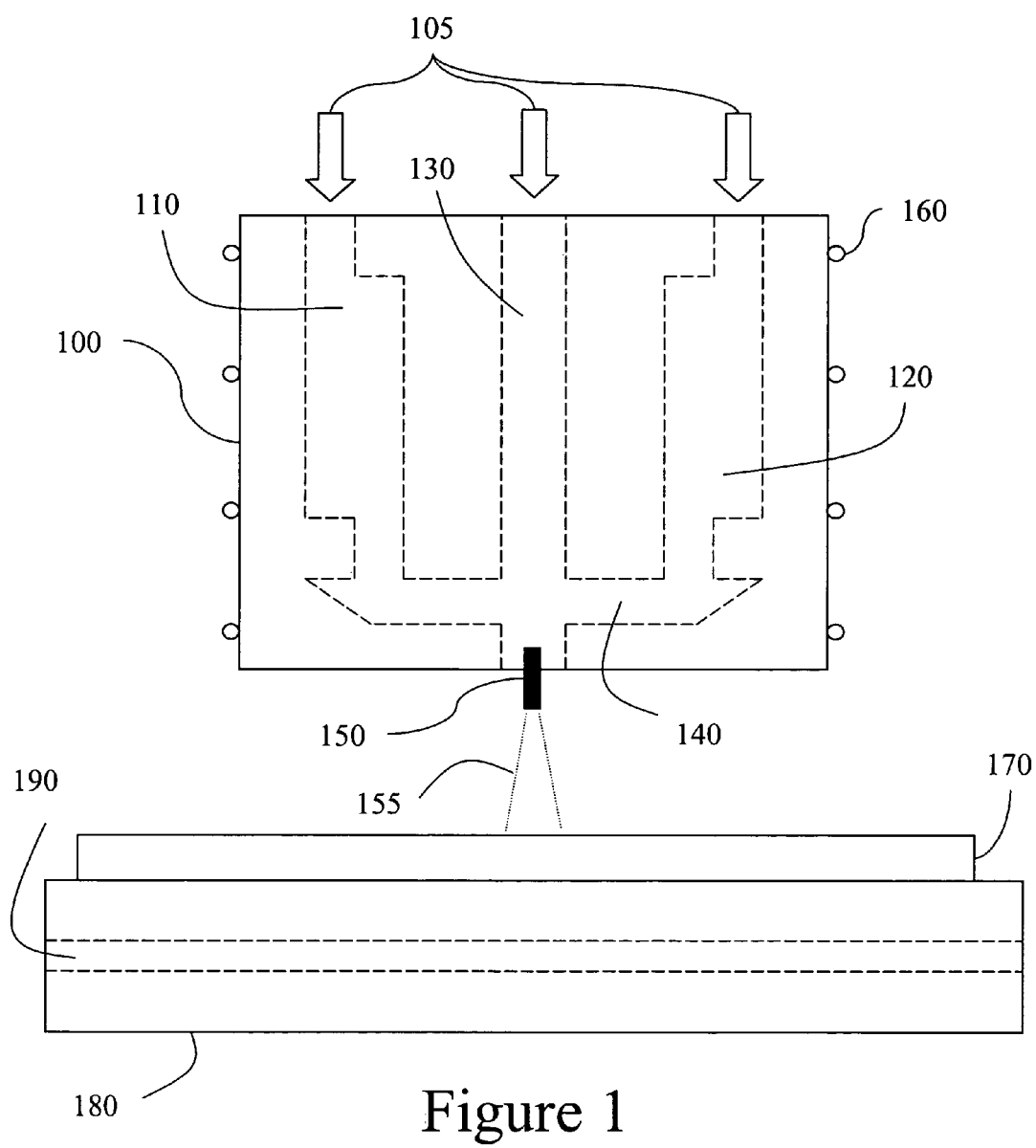
FIG. 1 shows an embodiment of an OVJP apparatus having multiple source cells.

Organic vapor jet printing (OVJP) is introduced for the direct patterning during growth of molecular organic semiconductor thin films. A hot inert carrier gas picks up organic vapor and expands through a microscopic nozzle, resulting in a highly collimated jet. The jet impinges on a cold substrate, leading to the selective physisorption of the organic molecules but not the carrier gas. The non-equilibrium nature of OVJP allows for high resolution, nearly 100% efficient, direct printing of organic semiconductor patterns and devices. The deposition rates may be very high, for example up to and exceeding 1000 Å/s. We demonstrate pattern resolution determined in part by the nozzle diameter and separation from the substrate. For example, employing a 20 μm diameter orifice, we obtained patterns of ~25 μm in diameter (1000 dots per inch). Further, we print an archetypal pentacene channel thin film transistor at a film deposition rate of 700 Å/s, resulting in hole mobility of 0.25 $cm^2/V \cdot s$ and current on/off ratio of $7 \cdot 10^5$, (comparable to performance achieved with vacuum deposited devices). Using a scaling analysis the influence of process conditions on the printing resolution and speed are determined. Combinatorial printing experiments and direct simulation Monte-Carlo models support the analysis. The printing of molecular organic semiconductors by OVJP allows for the rapid fabrication of both small- and large-scale electronic circuits. The process can be carried out in a range of upstream-to-downstream pressure gradients, depending on the nozzle size and number, while the downstream pressure preferably ranges from 0.1 to 1000 Torr. Due to the highly localized and directional characteristic of OVJP, embodiments of the invention allow for the direct organic film patterning is possible for substrates of virtually arbitrary size and shape. In addition to organic electronic device application, the method of OVJP provides access to new film growth regimes using highly localized hyperthermal organic beams, with additional, new degrees of control of film and crystal morphology.

In embodiments of organic vapor jet printing (OVJP), a hot inert carrier gas picks up molecular organic vapor and expands through a microscopic nozzle. The resulting collimated gas jet impinges onto a cold substrate, leading to the selective, localized deposition of the organic molecules, but not the carrier gas. Because OVJP does not use liquid solvents, it allows for greater latitude in the choice of substrate material and shape than other processes such as ink-jet printing, thereby permitting a wider variety of organic semiconductors and structures to be deposited. The molecules used for organic devices are typically stable against decomposition and pyrolysis up to 350-450° C., while having vapor pressures of up to several millibar, allowing high practical deposition rates.

One unique aspect of OVJP is that the organic species can be accelerated by the flow of a much lighter carrier gas to hyperthermal velocities. This can lead to denser and more ordered thin films, which potentially broadens the processing window for ultra-rapid growth of high quality thin films for device applications. This acceleration may also the instantaneous local deposition rate of OVJP to exceed that of the alternative broad-area deposition methods, resulting in a competitive advantage in the rapid printing of large-scale electronics. A typical OLED heterostructure is ~2000 Å thick. At 1000 Å/s and using a linear array of nozzles, each having a diameter to match the pixel width, a 1000 pixel wide display can be printed in ~30 minutes. The growth rates in the experiments discussed herein are already several orders of magnitude higher than the typical rates reported for fabrication of molecular organic electronic devices, but they can be increased further—for each 10° C. increase in the source temperature, the evaporation rate approximately doubles. OVJP is preferably used to deposit small molecule organic materials because they generally have sufficient vapor pressure at reasonable temperatures to allow for a high deposition rate. However, OVJP may have applications to other materials, such as polymers.

Embodiments of OVJP generally involve a "jet" of gas ejected from a nozzle, as distinct from other techniques, such as OVPD (organic vapor phase deposition), where a carrier gas may be used, but there is no "jet." A "jet" occurs when the flow velocity through the nozzle is sufficiently large to result in a significantly anisotropic velocity distribution relative to the isotropic velocities of a stagnant gas with molecules bouncing around. One way of defining when a jet occurs is when the flow velocity of the carrier gas is at least 10% of the thermal velocity of the carrier gas molecules.

Apparatus Description

An embodiment of an OVJP apparatus is schematically illustrated in FIG. 1. Device 100 includes a first organic source cell 110, a second organic source cell 120, a dilution channel 130, a mixing chamber 140, a nozzle 150, and heating elements 160. Organic source cells 110 and 120 may contain organic materials for deposition on a substrate 170. Each organic source cell may contain a different organic material or combination of organic materials. Carrier gas source(s) 105, schematically represented as arrows, may provide a flow of carrier gas to organic source cells 110 and 120, and dilution channel 130. Valves or other mechanisms may be used to determine whether, and how much, carrier gas flows through each of the organic source cells 110 and 120, and dilution channel 130. When a carrier gas flows through an organic source cell, the organic material contained therein may sublimate, and is subsequently carried by the carrier gas. The organic material and carrier gas then mixes in the mixing chamber with any other carrier gas and/or organic materials that enters from either the dilution channel or another organic source cell. Dilution channel 130 may be used to achieve more precise control at lower organic material concentrations than might be possible without a dilution channel. The mixture of one or more organic materials and carrier gas is then expelled through nozzle 150 towards substrate 170. Heating elements 160 may be used to control the temperature of the carrier gas and organic materials in device 100. By controlling the flow velocity and other parameters as explained herein, the flow mechanics of the expelled material may be controlled to form a collimated jet 155. Substrate 170 is disposed over a substrate holder 180, which may include a cooling channel 190. Any suitable positioning mechanism may be used to control the relative positions of substrate 170 and device 100. Cooling channel 190 may be connected to a coolant source, and may be used to control the temperature of substrate holder 180 and substrate 170. The organic material is then deposited on substrate 170, and the carrier gas flows away to the sides.

Device 100 may be made of any suitable material. Stainless steel is preferred for its durability and heat conductivity. Although only two organic source cells 110 and 120 are shown for clarity, more or less organic source cells may be used. Preferably, heating elements 160 may achieve a uniform heating of device 100. Preferably, individually metered carrier gas streams flow through each source cell to regulate the rate of delivery of the organic vapor. Device 100 also allows for "make-up" and "pusher" gas flow through dilution channel 130. A make-up gas flow may be used to regulate the concentration of organic vapor in addition to the source temperature. Pusher gas flow helps to avoid back-diffusion of vapor. In the embodiment of FIG. 1, both make-up and pusher functions may be achieved through dilution channel 130. The motion of substrate 170 is preferably along all 3 axes and computer-controlled.

Figure 2:
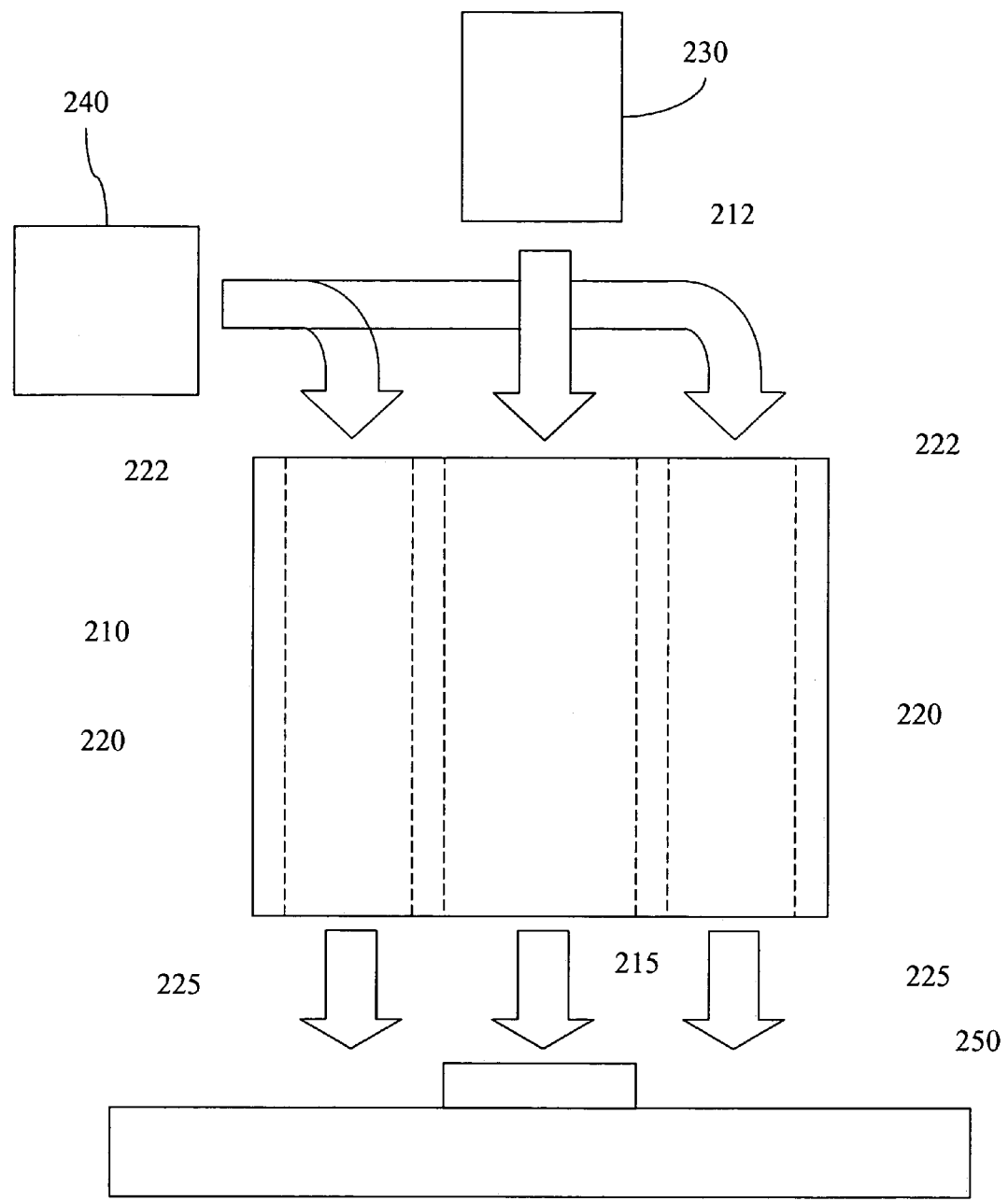
FIG. 2 shows an embodiment of an OVJP nozzle that can produce a guard flow.

Another embodiment of an OVJP apparatus is schematically illustrated in FIG. 2. Nozzle 200 comprises a nozzle tube 210 and a jacket 220. Nozzle tube 210 is defined by nozzle tube wall 217. Jacket 220, which is disposed adjacent to nozzle 210, is defined by nozzle tube wall 217 and jacket wall 227. Nozzle tube 210 has a first gas inlet 212 and a first exhaust aperture 215. Jacket 220 has a second gas inlet 222 and a second exhaust aperture 225. A carrier gas source 230 provides a flow of carrier gas carrying organic material to first gas inlet 212. A guard flow source 240 provides a flow of guard flow gas to second gas inlet 222. The carrier gas, carrying material to be deposited, flows out of first exhaust aperture 215. The guard flow gas flows out of second exhaust aperture 225. The gas sources of FIG. 2 are illustrated generally, and may include any components associated with providing a controlled gas flow to the nozzle, such as tubes, valves, gas cylinders, temperature control apparati, and other components.

In heated embodiments, heat may be provided in a variety of ways. The carrier gas source is preferably heated to a temperature suitable to sublimate, in a source cell, the appropriate concentration of molecule to be deposited. Other heat sources may be desirable to prevent the molecule from depositing onto the nozzle and elsewhere (other than the substrate, where deposition is desired) as it progresses out of the source cell and beyond. Preferably, the guard flow source provides heated guard flow gas, which then heats nozzle tube wall 217. Other heated embodiments may be achieved by using RF or other heating mechanisms to directly heat parts of nozzle 200, such as nozzle tube wall 217 and/or jacket wall 227.

An appropriate guard flow may confine the carrier gas and the molecules being deposited, and prevent them from spreading. Thus, a desirable sharper and higher resolution may be achieved. Preferably, the guard flow comprises a relatively heavy gas as compared to the carrier gas. Preferably, the guard flow gas is heavier than the molecular weight of the carrier gas, which enables the guard flow to more effectively contain the carrier gas.

Although the deposition can be carried out at atmospheric conditions, the downstream pressure, $P_L$, is reduced to 0.1-10 Torr in some embodiments to promote mass transport. To maintain the edge sharpness for deposited patterns as small as 25 μm the nozzle-to-substrate separation, s, is kept on the order of the molecular mean free path, λ, at the deposition pressure, (e.g. 100 μm>λ>1 μm for 0.1 Torr<$P_L$<10 Torr). Edge sharpness is preferred for some embodiments but not necessary. When λ is on the order of the apparatus dimension (which can be taken as either s, the nozzle diameter, a, or nozzle length, L), the flow is said to undergo a transition from the continuum to the free molecular flow regimes. Typical OVJP conditions result in such transition regime flow.

Modeling

A description of the physical picture of transitional flow may be derived from experiment and direct simulation Monte-Carlo (DSMC) techniques. The present specification, in addition to demonstrating OVJP of high-resolution organic thin film patterns and devices, examines how process conditions affect the growth rate and pattern resolution. A scaling model is developed and compared to DSMC simulations and OVJP experiment.

A mass balance on the organic species in the source cell (7) gives the expression for the vapor pressure of the organic species exiting the source cell:

$$P_{org} = \frac{P_{org}^{sat} \cdot k}{k + \dot{V}/RT_{cell}} \quad (1)$$

where $P_{org}$ is the vapor pressure, $P_{org}^{sat}$ is the saturation (equilibrium) vapor pressure of the organic material, $\dot{V}$ is the carrier gas volumetric flow velocity, and k is a constant describing the kinetics of the evaporation from the organic surface inside the source cell. Equation (1) shows that the carrier gas flow rate, as well as the source temperature, may regulate the flux of organic vapor, which is a consideration for regulating the concentration of dopants in the deposited films.

Downstream from the source cell, OVJP differs significantly from vapor-phase deposition and ink-jet printing. Unlike vapor-phase deposition, OVJP is not diffusion limited near the substrate, and, unlike ink-jet printing, OVJP does not take place in the liquid phase. The flow rate of gas through the nozzle, Q, is the product of the pressure driving force and the nozzle conductance:

$$Q = C \cdot (P_H - P_L) \quad (2),$$

where the driving force is the difference in the upstream and downstream pressures ($P_H$ and $P_L$), and the conductance, C, is expressed as:

$$C = \left[\frac{4}{3L}\sqrt{\frac{2\pi kT}{M}} a^3\right] \cdot \left(0.1472\frac{a}{\lambda} + \frac{1+3.50 a/\lambda}{1+5.17 a/\lambda}\right), \quad (3)$$

where the quantity in the first brackets is calculated from the kinetic theory, and then modified by an empirical factor for different gas mixtures and conditions. Due to the large difference in the molecular weights of the organic and carrier gas species used in OVJP, Eq. (3) may be further corrected to reflect thermal slip near the inner wall of the nozzle.

Figure 4:
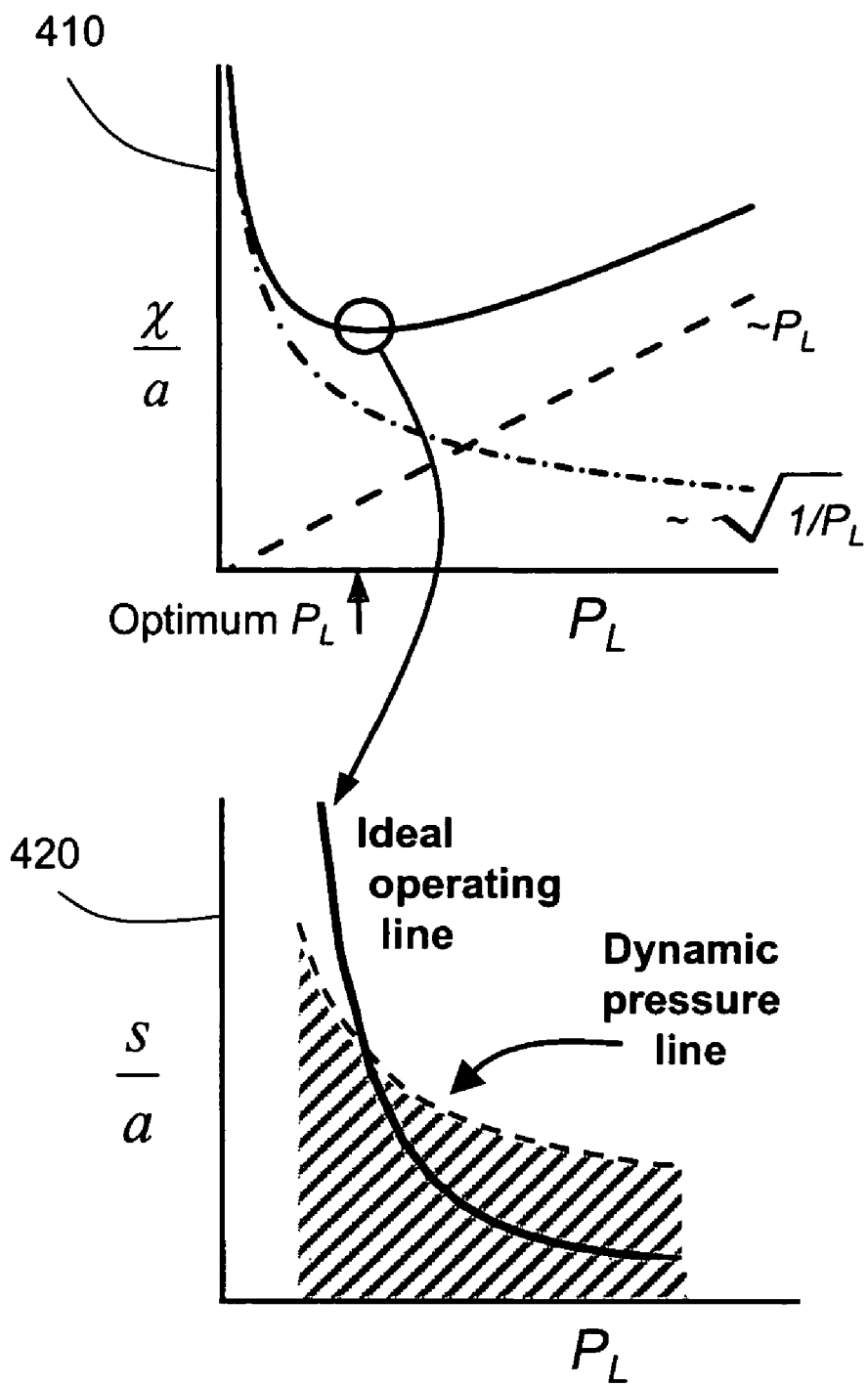
FIG. 4 shows a plot of the qualitative dependence of the normalized deposit width vs. downstream pressure, and a related plot of the qualitative relationship between nozzle radius, nozzle/substrate separation, and downstream pressure.
Figure 5:
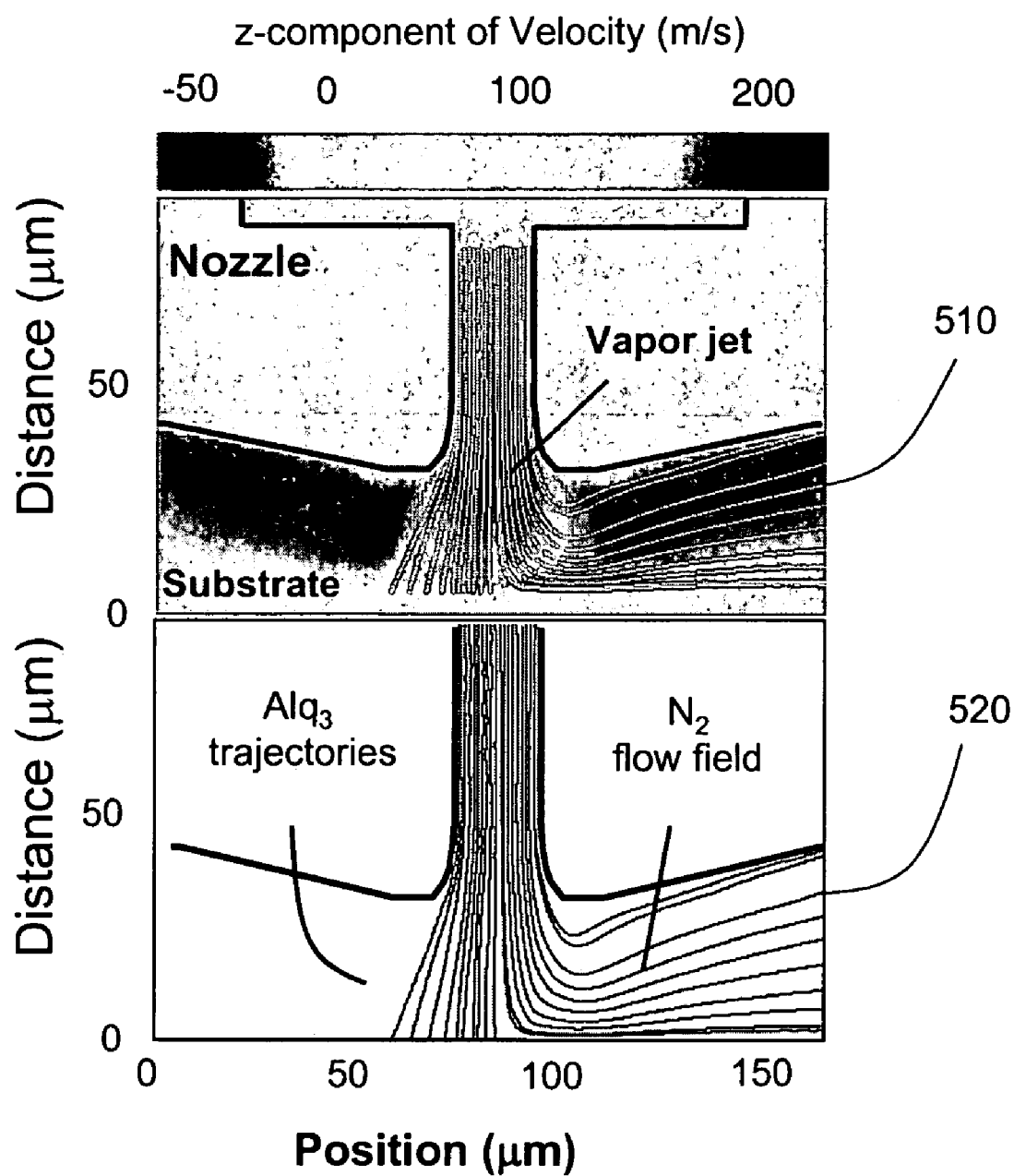
FIG. 5 shows calculated velocity and flow lines for particles ejected from a nozzle.

While the light carrier gas species are strongly scattered radially by the substrate, the heavier organic species retain more of their axial momentum (in proportion to the ratio of the organic molecular masse to that of the carrier gas, $m_o/m_c$). This mechanism is confirmed by DSMC results, as shown in FIGS. 4 and 5. If the separation s is on the order of the λ near the substrate, the organic molecules suffer few collisions within the nozzle-substrate gap. Assuming that the organic moieties attain the bulk flow velocity $\bar{u}$ inside the nozzle, their transport rate $u_z$ in the z-direction is:

$$u_z \approx \bar{u} = Q/\pi a^2. \quad (5)$$

The average velocity with which the organic molecules are dispersed radially outward from the nozzle may be expressed as:

$$u_r \approx \bar{u} \cdot \frac{a}{2s} \cdot \frac{m_c}{m_o} \cdot \frac{s}{\lambda} + v_D \quad (6)$$

where χ is the radial distance traveled after emerging from the nozzle, $m_c$ and $m_o$ are the carrier gas and organic molecular weights, respectively, while $v_D$ is the contribution from pure diffusivity of the organic particle. This (isotropic) diffusion contribution can be approximated by:

$$v_D = \frac{\sqrt{6Dt}}{t}, \quad (7)$$

where D and t are the gas diffusivity of the organic species and the time spent en route to the substrate, respectively.

Assuming fully developed flow inside the nozzle, a low (<1% molar) concentration of the organic species, incompressible flow and mass conservation of the carrier gas phase, it can be shown that the organic molecules travel radially outward from their original position in the nozzle by a distance χ:

$$\frac{\chi}{a} = \frac{m_c}{m_o} \cdot \frac{s}{\lambda} + \sqrt{\frac{1}{3} \cdot \frac{\bar{c} \cdot s \cdot \lambda}{\bar{u} \cdot a^2}}, \quad (8)$$

where, $m_c/m_o$ is the organic-to-carrier gas molecular mass ratio, $\bar{c}$ is the molecular mean thermal velocity, and $\bar{u}$ is the mean flow velocity inside the nozzle. The first term in Eq. (8) quantifies the horizontal momentum transfer to the organic molecules from collisions with the diverging carrier gas, while the second term represents the scaling of the radial diffusion rate to the ballistic transport rate normal to the substrate.

Figure 3:
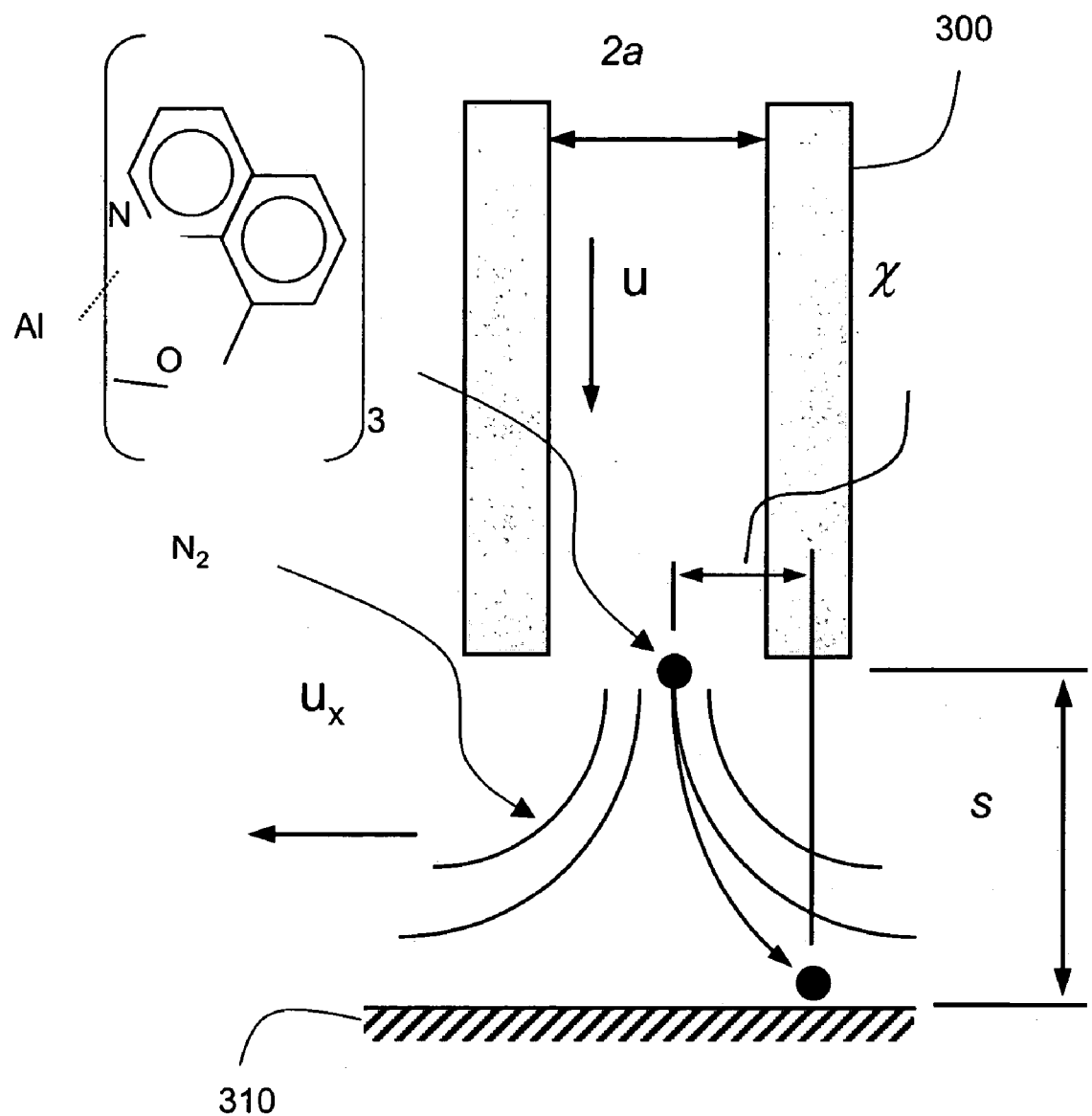
FIG. 3 shows a schematic of an OVJP nozzle illustrating carrier gas and organic molecule trajectories.

Although Eq. (8) does not predict the exact deposit shape, it shows the relative influence of process conditions on the deposited pattern resolution. In particular, given that $\lambda = kT/\sqrt{2}\sigma P_L$, where σ is the cross-section of the molecule, the dispersion has a minimum for some value of $P_L$, as shown in FIG. 3. The value of $P_L$ corresponding to maximum resolution is in the range of 1-50 Torr for typical OVJP conditions. Equation (8) also suggests that pattern definition is enhanced through use of a lighter carrier gas (e.g. He instead of $N_2$). Practically, a is fixed by the desired deposition rate via the total flux of the organic molecules in the nozzle. Thus, for a given nozzle radius α, the remaining adjustable parameters are s and $P_L$. The operating conditions for maximum pattern resolution can thus be plotted on a process diagram (FIG. 4), where the operating line dictates values of s for any given $P_L$. For example, to maintain high pattern resolution even at large separation, s, the downstream pressure, $P_L$, may be decreased. The region above the operating line represents diffusion-limited printing, while the region below corresponds to convection-limited operation. Finally, the local dynamic pressure in the region between the nozzle and the substrate generally exceeds $P_L$ and scales inversely with s. This places a lower limit on the effective $P_L$, as indicated by the "Dynamic Pressure Line", such that the minimum in the pattern dispersion curve with $P_L$ may not be observable under practical OVJP conditions.

A common feature of a single nozzle expansion is that it produces a flux profile domed in the center for virtually all upstream and downstream conditions. Thus, to achieve a flattened-top deposit, the nozzle can be rastered over an area. Alternatively, a bundle of nozzles or a miniaturized "showerhead" can be used to produce the same effect. Since the conductance of a nozzle scales with $a^3$ (see Eq. 4), the printing speed can be maximized in the latter approach. Furthermore, in view of Eq. (8), an annular guard flow of a relatively heavy gas (e.g. Ar or $SF_6$) may be used in conjunction with a main flow of a lighter gas (e.g. $H_2$ or He) to increase deposit sharpness. The annular guard flow may be used in connection with other methods of increasing sharpness, such as rastering and the showerhead approach. With a guard flow, the organic species are maximally accelerated and collimated by the main carrier gas flow, while the radial diffusion of species is hindered by the guard flow made up of a heavier inert gas.

FIG. 3 shows a schematic illustrated of a nozzle 300 having a hollow cylindrical configuration, in the vicinity of a substrate 310. Carrier gas stream lines (solid black lines) and an expected trajectory of an organic molecule (curved arrow) are qualitatively illustrated. Several variables from Equations 1-8 are illustrated as well. Although the carrier gas flow field rapidly diverges due to the proximity of the substrate to the nozzle outlet, the relatively heavy organic molecules acquire trajectories substantially more collimated than the carrier gas. As discussed herein, the interplay between diffusive and convective processes at the nozzle orifice dictates the relationship between the pattern shape, nozzle radius (a), nozzle-to-substrate separation (s), and the pressure in the region downstream from the nozzle ($P_L$). The scaling is usually such that s, the pattern resolution, and the molecular mean free path (λ) at $P_L$ are of the same magnitude, as indicated in FIG. 3. This implies that downstream from the nozzle, transport is intermediate between continuum and molecular flow. Experiment and direct simulation Monte-Carlo (DSMC) techniques are the best ways to obtain an understanding of this type of transport.

FIG. 4 shows a plot of the qualitative dependence of the pattern dispersion, $\chi/\alpha$, on the downstream pressure, $P_L$, and a related plot of the relationship between nozzle radius, nozzle/substrate separation, and downstream pressure. Plot 410 shows a plot of the qualitative dependence of the pattern dispersion, $\chi/\alpha$, on the downstream pressure, $P_L$. The dispersion is minimized at a given value of $P_L$, due to the opposing balance of convective and diffusive transport rates. Plot 420 shows a plot of the relationship between nozzle radius, nozzle/substrate separation, and downstream pressure, for the region identified by a circle in plot 410. The conditions for the highest pattern resolution (minimum dispersion) are plotted to give the optimum operating line. Working above or below this line may decrease pattern resolution. Increasing s and $P_L$ results in diffusion controlled transport, while decreasing s and $P_L$ results in convection controlled transport. The actual "dynamic pressure," i.e. the pressure between the nozzle and the substrate surrounding the jet, may be higher than the ambient (or background) pressure $P_L$, due to the interaction between the jet and the ambient pressure. Hence, the "dynamic pressure" line is lower and sets the practical operating regime. The operating regime signified by the shaded region under the dynamic pressure line is inaccessible by some embodiments. Without being limited to any theory as to how the invention works, it is believed that the jet flow decelerates near the substrate, and a part of the kinetic energy of the jet stream is converted into potential energy in the form of a higher pressure in the region immediately surrounding the jet stream.

While there is no simple qualitative relationship that exactly determines the dynamic pressure as a function of various relevant parameters such as the background pressure, the stream velocity, etc., it is believed that the dynamic pressure will generally not exceed 10 times the background pressure for the case of a jet ejected from a nozzle without a guard flow, at velocities reasonably contemplated for OVJP, and where the nozzle-substrate separation is on the same order of magnitude as the nozzle radius. In most cases, the dynamic pressure will not exceed twice the ambient pressure. The simulation needed to determine the dynamic pressure is well within the skill of one in the art based on the disclosure herein.

Details of the flow calculated by DSMC are shown in FIG. 5. Plot 510 shows a vertical velocity component of the flow field. The corresponding trajectories of the carrier gas and the organic molecules (in this case, tris-(8-hydroxyquinoline)-aluminum, or Alq$_3$) plotted in plot 520. The velocity map shows the acceleration of the flow through the nozzle, reaching a velocity ~200 m/s at the nozzle exit, and the stagnation front immediately above the substrate surface, where the dynamic pressure generally exceeds the ambient pressure, $P_L$, far away from the nozzle region. Velocity is represented as shading on plot 510, with the highest velocity in the nozzle, and the lowest furthest away from the nozzle. The heavy organic molecular trajectories, however, cross the carrier gas flow lines, resulting in a well-defined deposit. Preferably, the molecular weight if the organic material is greater than the molecular weight of the carrier gas to achieve this divergence between the organic trajectories and the carrier gas trajectories.

Figure 6:
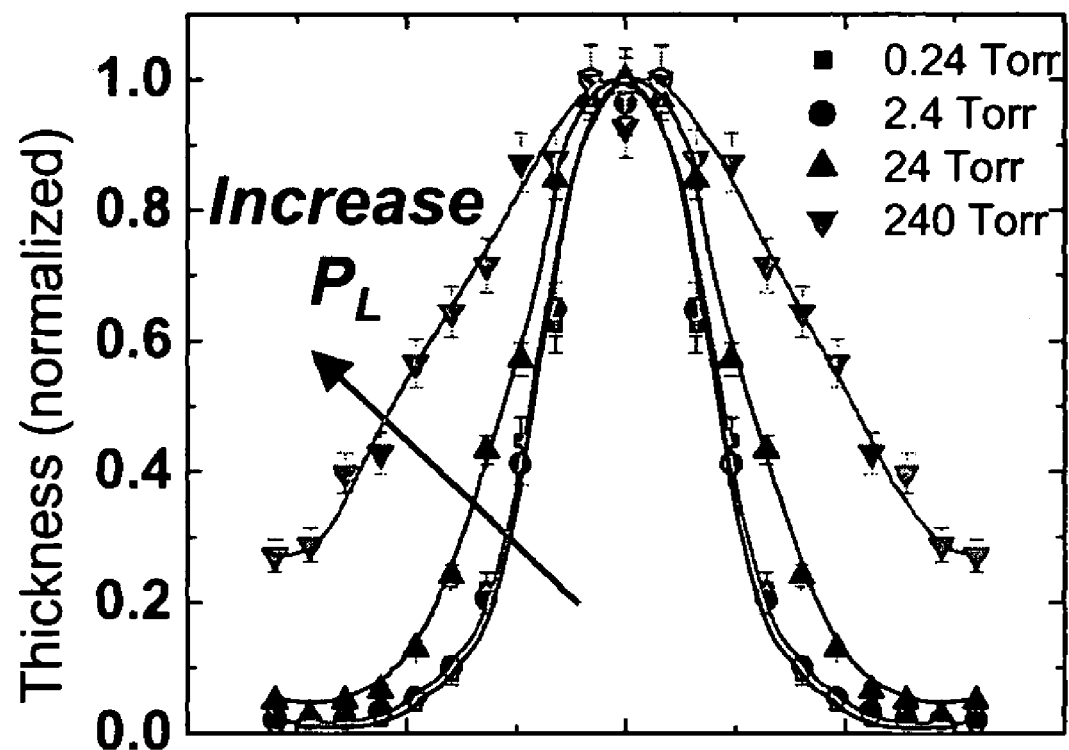
FIG. 6 shows calculated thickness profiles for various downstream pressures.
Figure 7:
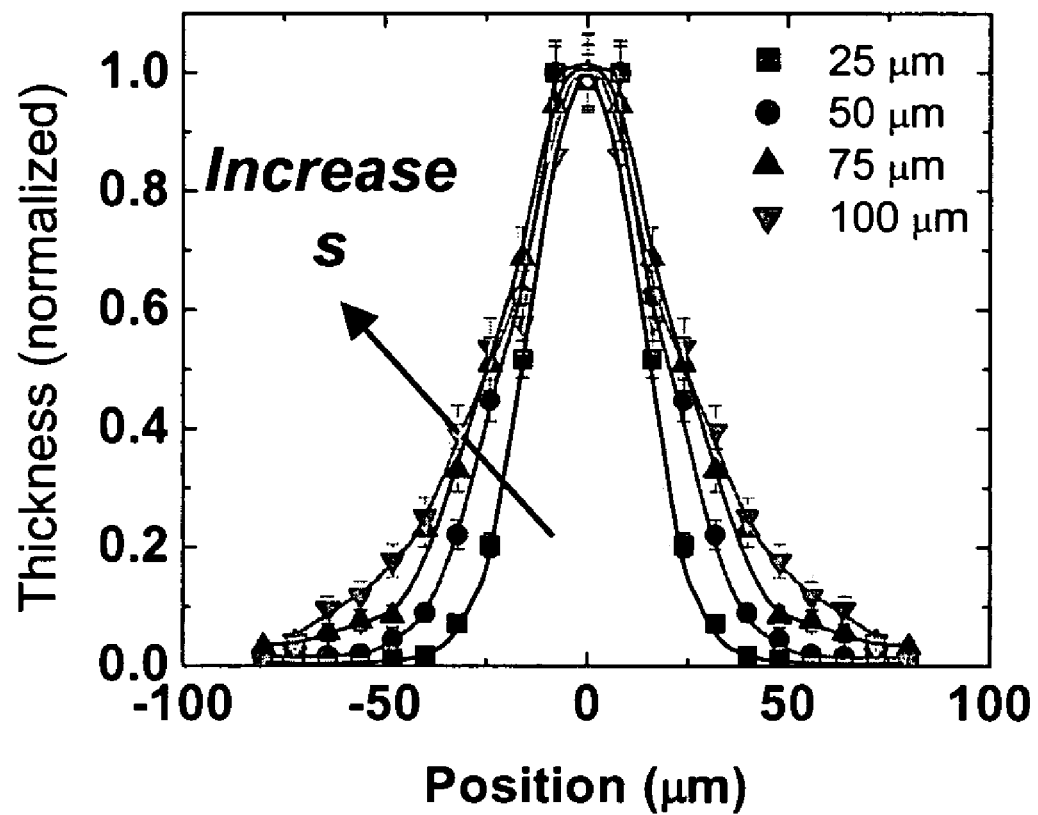
FIG. 7 shows calculated thickness profiles for various nozzle—substrate separation distances.

The deposit profiles obtained from DSMC for different printing conditions are plotted in FIGS. 6 and 7, where the broadening of the deposit due to increasing s and $P_L$ is evident. The pattern width first varies slowly with $P_L$, but then increases rapidly, indicating that the conditions are near the dispersion minimum, but that the dynamic pressure exceeds $P_L$.

It is believed that the profile of the deposited material is favorably affected by a dynamic pressure of at least 1 Torr, and more preferably be a dynamic pressure of at least 10 Torr.

Experimental

Devices were fabricated using an organic vapor jet printer having an appearance similar to device 100 of FIG. 1. The organic vapor jet printer consisted of a stainless steel, 5-source chamber, approximately 40 mm in diameter and 60 mm long, with heated walls. The source cells were 5 mm×10 mm hollow stainless steel cylinders. The source materials were pentacene and tris(8-hydroxyquinoline)-aluminum (Alq$_3$), widely employed in organic TFT and LED work, respectively. Both materials were pre-purified twice by vacuum train sublimation and then loaded into their respective cells, sandwiched between two small quartz wool plugs. Depending upon the particular experiment, one or more of the five source cells may not have been used. Nitrogen was used as the carrier gas. The vapor and nitrogen were forced through a collimating nozzle and onto a cooled substrate, which was mounted on a computer-controlled, motorized xyz-motion stage. The background gas pressure in the deposition chamber was maintained between 0.1 and 1000 Torr by means of a roughing pump and a throttle valve. The deposited patterns were imaged with optical and scanning electron microscopes. The substrates used for the TFT deposition were highly conductive silicon wafers with a 210 nm thick layer of dry thermal SiO$_2$ as a gate dielectric. Prior to deposition of pentacene, the substrates were cleaned and exposed in vacuum to a saturated vapor of octadecyl-trichlorosilane (OTS) for 15 minutes at room temperature. The cleaning procedure consisted of sonication of the SiO$_2$-coated substrates in a soap solution, de-ionized water, acetone, trichloroethylene (twice), acetone (twice), and isopropanol (twice), followed by a 10-minute exposure in a UV-ozone chamber. Gold source and drain contacts were deposited by vacuum thermal evaporation after the printing of pentacene. A Hewlett-Packard Model 4155 parameter analyzer was used to obtain the current-voltage transfer characteristics of the TFTs, which were tested inside of a metallic isolation box, in the dark, at ambient conditions.

Figure 8:
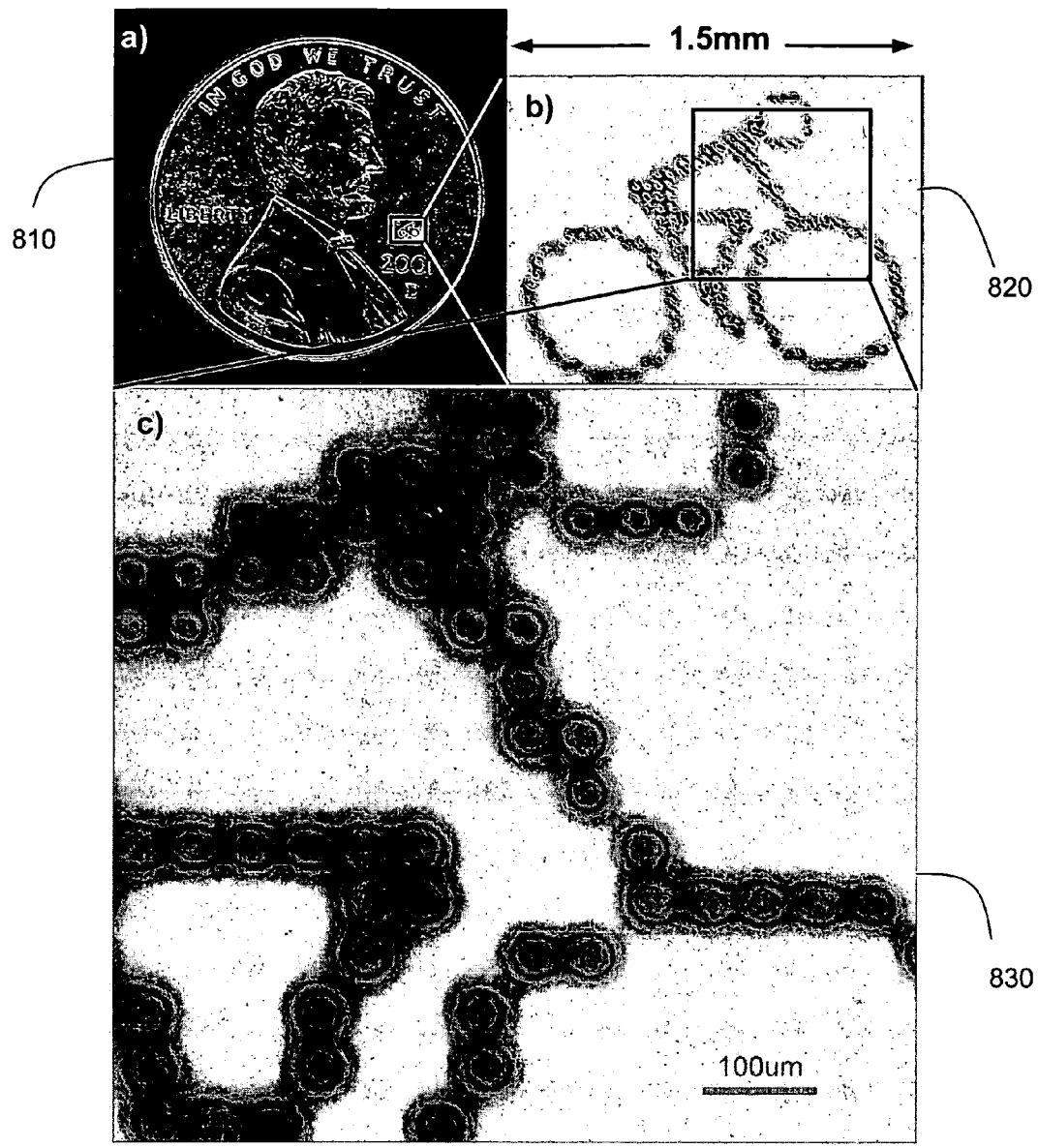
FIG. 8 shows an image printed by OVJP.

FIG. 8 illustrates an image printed by OVJP at several different scales. Image 810 shows the image superimposed on a penny. Image 820 is the image with a 1.5 mm scale line. Image 830 is the image with a 100 micron scale line. The image was generated by OVJP of Alq$_3$ (flow channel diameter $\alpha$=20 μm, wall thickness L=100 μm, nozzle to substrate distance s=20±10 μm, a dwell-time of 2 seconds above each pixel location, a movement time between pixels of less than 0.2 sec, upstream pressure 430 Torr, downstream pressure 0.24 Torr, Alq$_3$ source cell temperature=270° C., substrate temperature=15° C., deposition rate approximately $r_{dep}$=1300 Å/s). It is expected that the deposition rate could be increased to over 8000 Å/s by increasing the source temperature to 300° C., without damaging the organic materials. At this growth rate, an array of 800 nozzles can print an SVGA resolution display (600×800 OLED pixels) in under one minute. This speed is comparable to the current state-of-the-art inkjet printers, which also use print heads containing in excess of 500 nozzles. To obtain pixels with flat-top profiles, the nozzle can be rastered or dithered laterally during growth; alternatively, a manifold of closely spaced nozzles can replace the dithered single nozzle.

Figure 9:
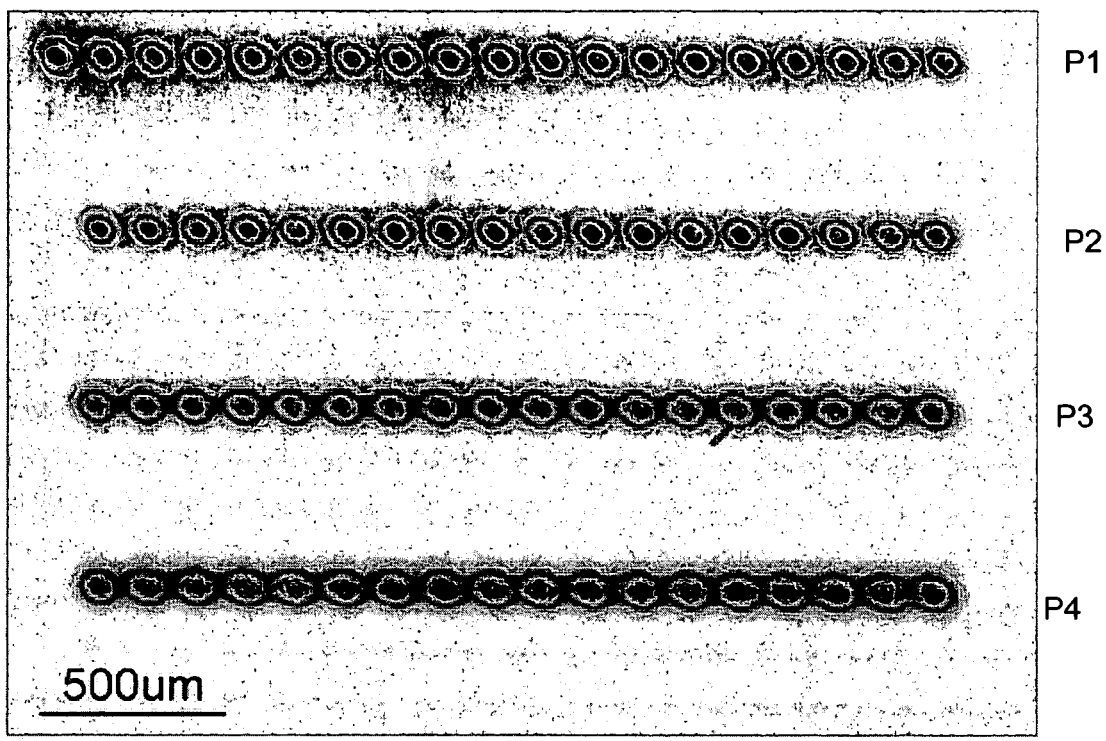
FIG. 9 shows an optical micrograph of pentacene dots printed by OVJP.

FIG. 9 shows an optical micrograph of rows of pentacene dots printed on Si with a 40 μm×250 μm (α×L) nozzle outlet positioned at a distance s=30 μm from the substrate. Interference fringes reflected off of the substrate and deposit surfaces allow the deposition shape to be determined, using known techniques. Each row of dots was deposited at a different chamber pressure ($P_1$=1.33, $P_2$=0.9, $P_3$=0.5, $P_4$=0.17 Torr), while the upstream pressure was maintained constant at Phigh=240 Torr. This combinatorial deposition shows the OVJP regime where pattern resolution can be enhanced by increasing the chamber pressure. This result is somewhat counterintuitive, because one might expect a higher chamber pressure to result in more scattering off of gas molecules in the chamber (for example, as would be expected in OVPD), and thus a decreased resolution at higher chamber pressures. Instead, it has been discovered that a higher chamber pressure may enhance resolution. Without being limited to any theory as to how aspects of the invention work, it is believed that, in the flow regime of OVJP, a higher chamber pressure confines the gas jet.

Based on these results, it is expected that OVJP may be practiced at higher background pressures than one might otherwise believe. In fact, at higher pressures, there is a favorable effect on the shape of the deposition. This favorable affect is visible at a back ground pressure of 0.1 Torr, and becomes more pronounced at higher pressures such as 1 Torr, 10 Torr and 100 Torr. As demonstrated herein, devices may be fabricated at atmospheric pressure (760 Torr), which may greatly reduce the need for expensive capital equipment for fabricating devices. It is believed that the favorable effect may manifest at background pressures as low as 10e-3 Torr, but may not be noticeable and as apparent as demonstrated herein. In addition, the higher pressures (0.1 Torr and above) may be achieved with less sophisticated vacuum apparatus, so there is a significant advantage from a cost perspective to operating at a background pressure higher than previously thought possible.

Figure 10:
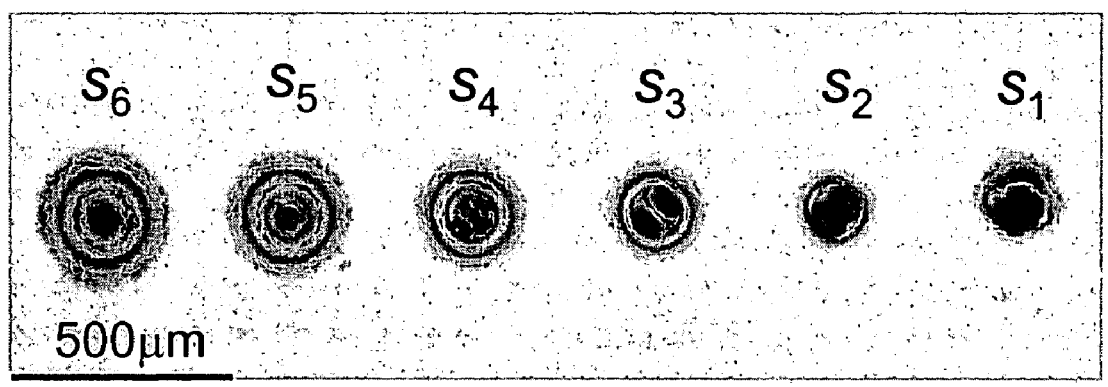
FIG. 10 shows an optical micrograph of $Alq_3$ dots printed by OVJP.

FIG. 10 shows an optical micrograph of tris-(8-hydroxyquinoline)-aluminum ($Alq_3$) dots printed onto Si using a 20 μm×100 μm nozzle, at $P_{high}$=240 Torr and $P_{low}$=0.24 Torr. The distance from the nozzle outlet to the substrate s was varied (25, 53.4, 81.8, 110.2, 138.2, and 167)±10 microns, with S1=25 and S6=167 μm. The dwell time at each dot location was 60 seconds.

Figure 11:
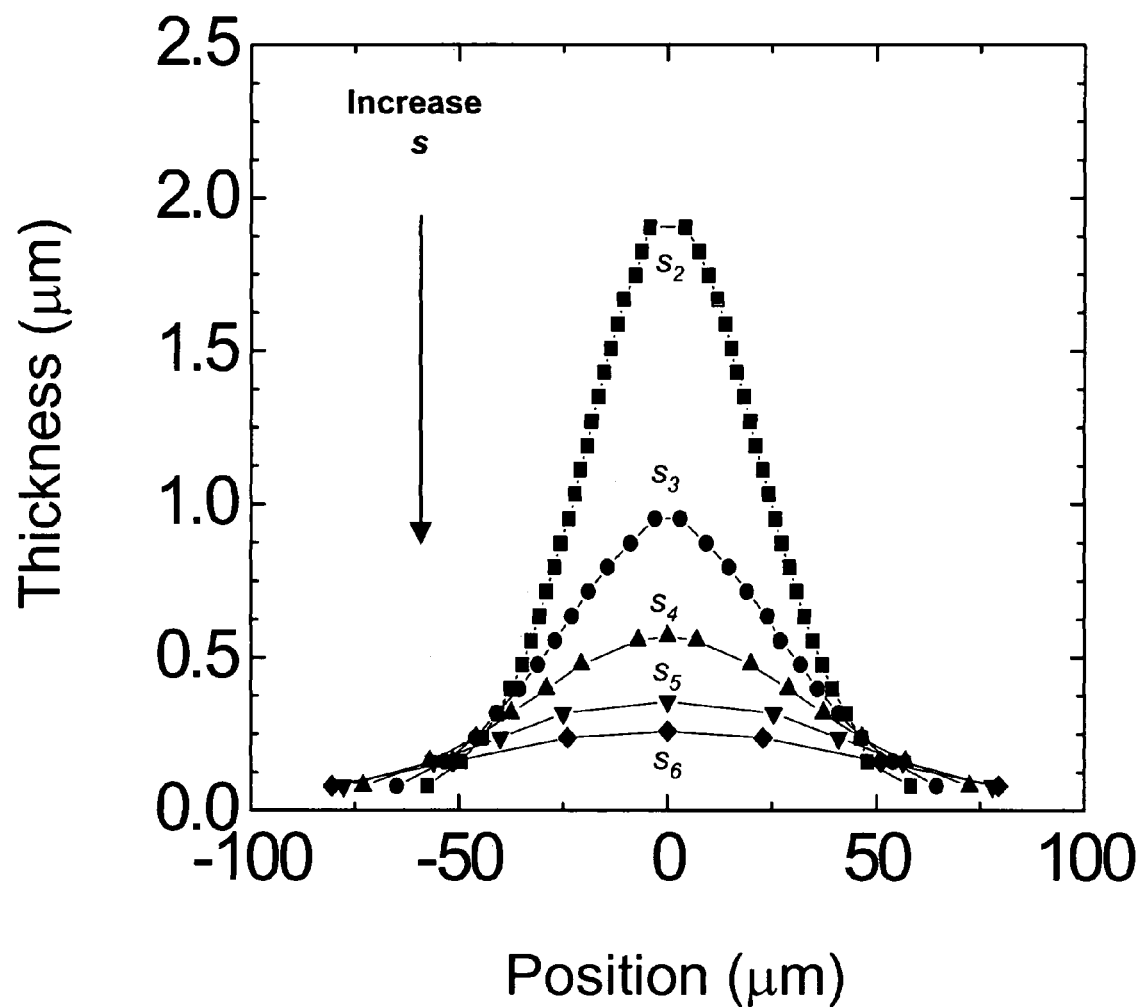
FIG. 11 shows thickness profiles for the dots of FIG. 7.

FIG. 11 shows thickness profiles calculated from the interference fringe patterns of FIG. 10. For sufficiently thick deposits, light-interference fringes allow the deposit profile to be determined.

Figure 12:
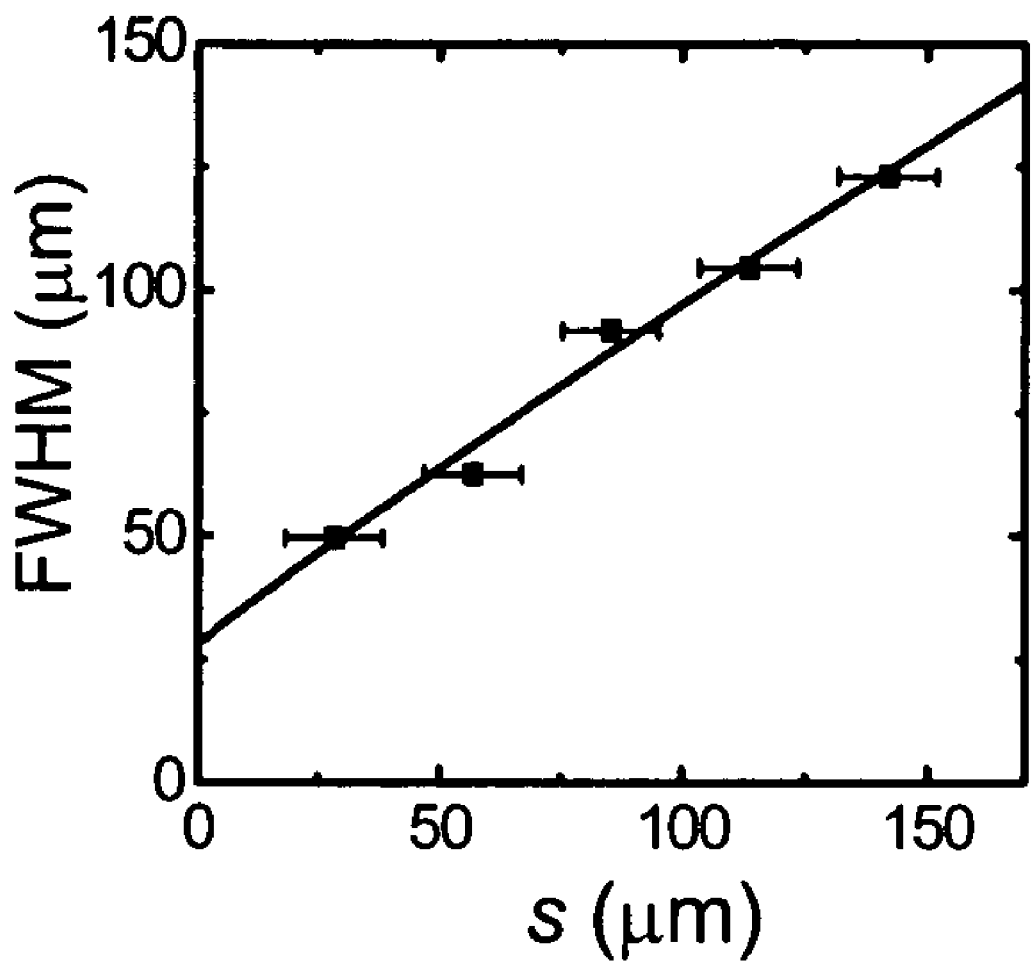
FIG. 12 shows a plot of the full width half maximum of the thickness profiles of FIG. 9 v. the square root of nozzle-substrate separation.

Equation (8) predicts that the pattern dispersion, χ, should scale as $s^{1/2}$. FIG. 12 shows that (FWHM)$^2$ scales linearly with s, in agreement with Eq. (8). The full width-half maximum (FWHM), as taken from the thickness profiles of FIG. 11 after normalization, was used as a measure of χ.

Figure 13:
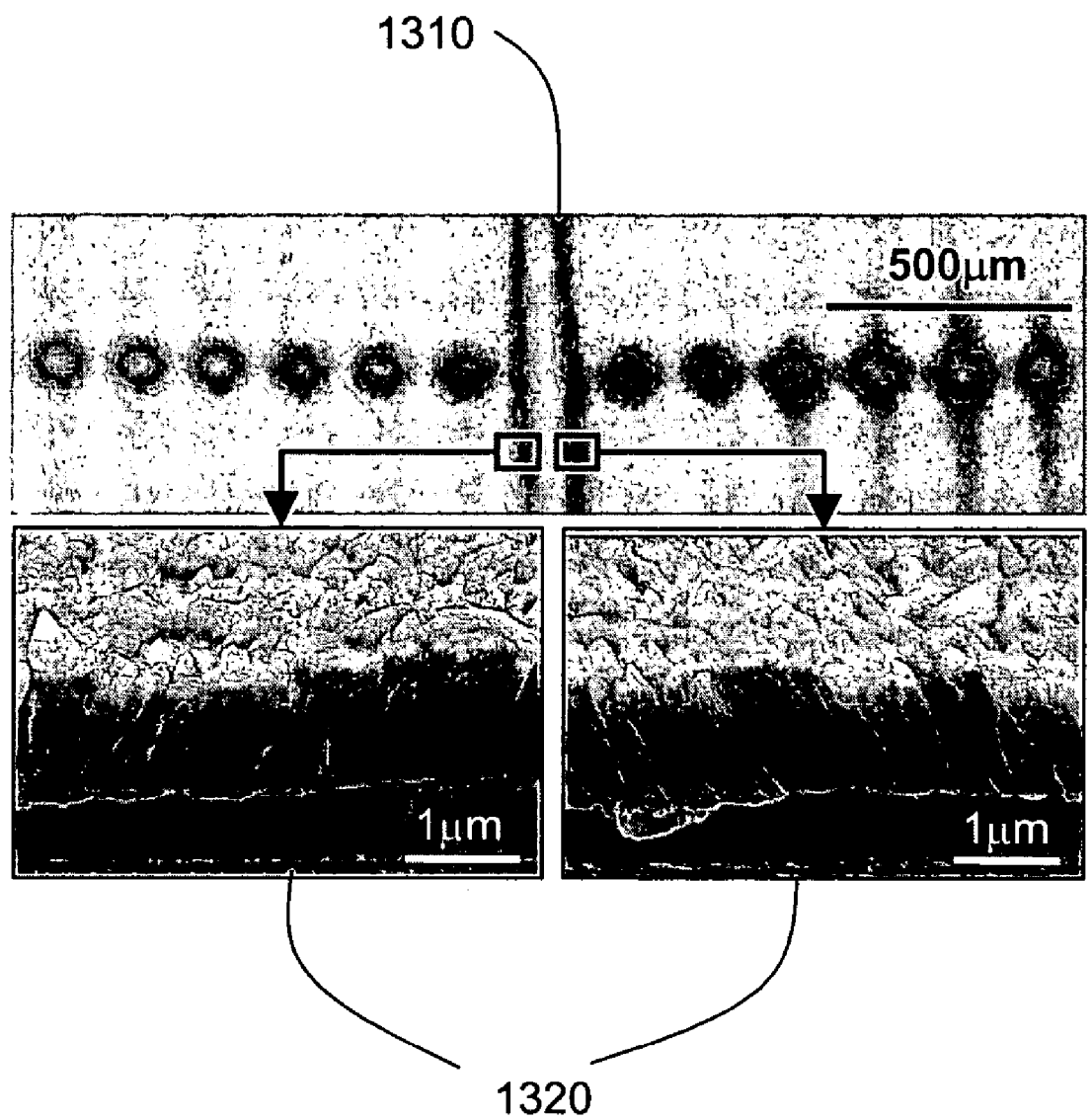
FIG. 13 shows a scanning electron micrograph of a pentacene line deposited by OVJP.

FIG. 13 shows a scanning electron micrograph (SEM) of a pentacene line printed on $SiO_2$ with a local deposition rate >300 Å/s and s=35±15 nm. Image 1310 is the a pentacene line with a 500 micron scale line, while images 1320 are the same pentacene line at a higher magnification with a 1 micron scale line. The image reveals that the pentacene grows in the shape of slanted nano-pillars. The nano-pillars situated to the left and the right of the jet center tilt in toward the nozzle, toward the direction from which gas flows. This effect is not observed in diffusion-limited growth, such as occurs in OVPD, but may be caused by the self-shadowing of pentacene crystallites during the highly directional "feed" of the crystals during the OVJP process. This directionality is due to the anisotropic molecular velocity distribution in the gaseous jet. A similar crystal growth mode has been observed during glancing angle deposition of metals. Seeding the organic molecules in a fast-flowing carrier stream also allows near- to hyper-thermal velocities to be reached by the adsorbent and, consequently, the tuning of incident kinetic energy. This decouples the film crystallization dynamics from surface temperature, leading to highly ordered films even for relatively cold substrates. This effect has important implications for improving the performance of devices, such as polycrystalline channel TFTs.

To demonstrate the feasibility of the very high local deposition rates for device application, OVJP was used to print pentacene channel TFTs. The pentacene channel was printed in the form of a 6 mm×6 mm uniformly filled square by rastering the narrow jet over a 5 mm×5 mm substrate area. The TFT channels were defined by the Au drain-source electrodes, which were deposited in vacuum immediately following the printing of pentacene. The printing employed a 350 μm diameter nozzle, with s=1000 μm, $T_{source}$=220° C., $T_{substate}$=20° C., $Q_{source}$=5 sccm, $Q_{dilution}$=5 sccm, $P_{high}$=20 Torr, and $P_{low}$=0.165 Torr, resulting in a local pentacene growth rate ~700 Å/s.

Figure 14:
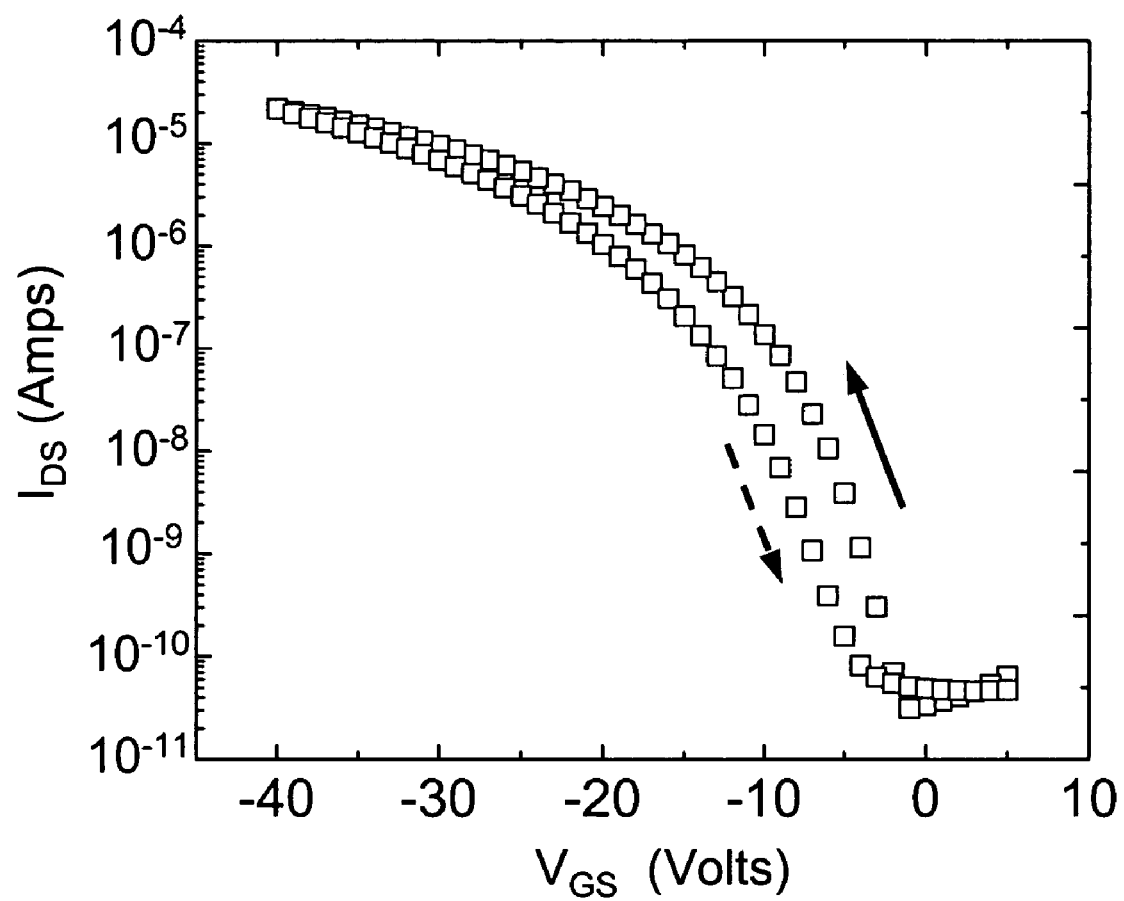
FIG. 14 shows a plot of drain-source current v. drain-source voltage for a TFT deposited by OVJP.
Figure 15:
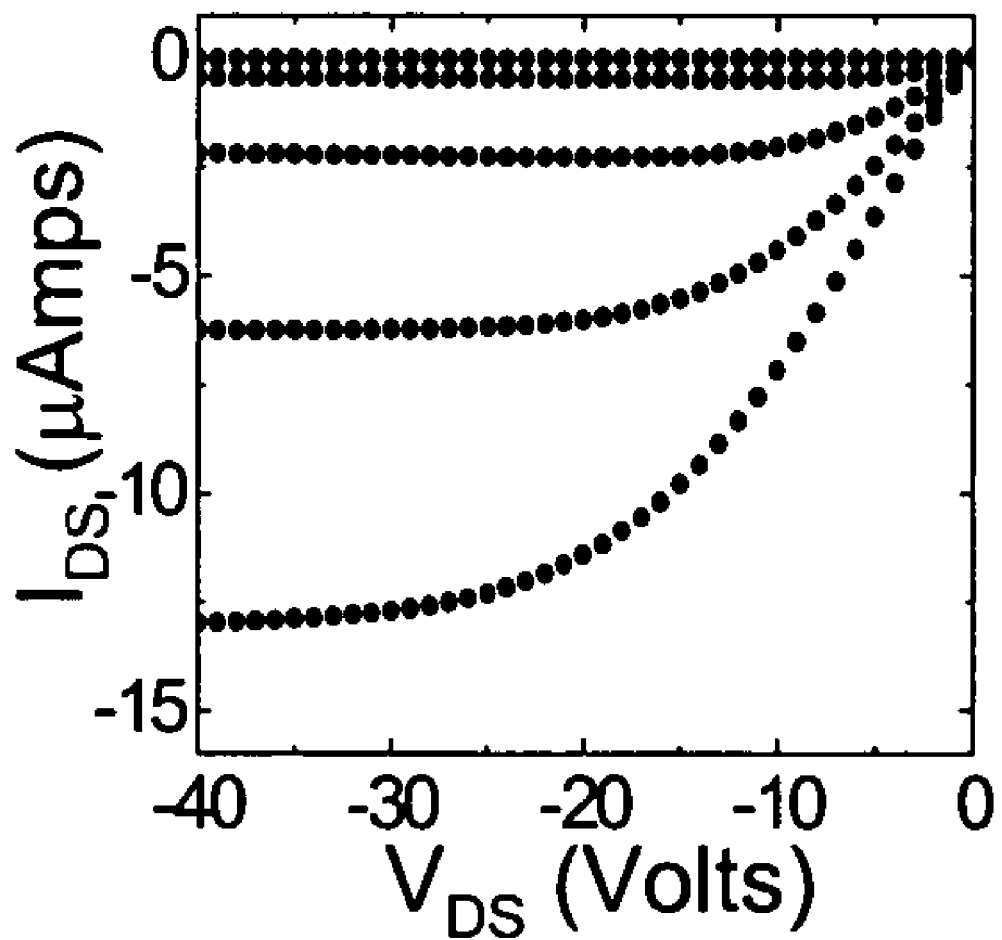
FIG. 15 shows a plot of drain-source current v. gate-source bias for a TFT deposited by OVJP.

The active pentacene channel had a gate width/length ratio of 1000/45 (±5) μm, and consisted of a 5000 Å thick pentacene film with an average grain diameter of <200 nm. The device drain-source current ($I_{DS}$) versus voltage ($V_{DS}$) characteristic is plotted in FIG. 14, showing the drain-source current saturation behavior similar to that previously observed for vacuum and OVPD grown pentacene TFTs. The characteristic was obtained from the drain-source current saturation regime at $V_{DS}$=-40V. The TFT exhibited some hysteresis in the $I_{DS}$ vs. $V_{GS}$ behavior, with the threshold voltage shifting from +10 to +17 V in the forward and reverse $V_{GS}$ directions, as indicated. The $I_{DS}$ vs. the gate bias ($V_{GS}$) is plotted in FIG. 15, revealing an $I_{DS}$ on/off ratio of 7-105 and a channel field-effect hole mobility of $\mu_{eff}$=0.25±0.05 cm$^2$/V·s in the saturation regime. The hole mobility of a vacuum-deposited control TFT deposited via thermal evaporation was similar, but, due to thinner pentacene in the channel region, it showed a smaller source-drain off current.

Organic vapor jet printing was also used to print pentacene TFTs in nitrogen at atmospheric pressure; the TFTs exhibited $\mu_{eff}$=0.2 cm$^2$/V·s. The hole mobility of a vacuum-deposited control TFT was within the experimental error of the values obtained by OVJP at $P_L$=0.2 Torr. The cost of device and circuit fabrication can be significantly reduced by the ability to directly print small-molecular organic transistors at ambient conditions, such as in a nitrogen glove box.

The deposition of a working device at atmospheric pressure is particularly significant, because it demonstrates the feasibility of using OVJP without expensive and cumbersome vacuum equipment that requires time to pump down. For example, the ability to deposit at atmospheric pressure may greatly facilitate the deposition of organic materials in a large scale assembly line. It may be desirable to deposit in a controlled atmosphere to avoid impurities, such as in a glove box filled with an inert gas such as nitrogen, but such a controlled atmosphere may be significantly cheaper, easier and faster to provide as compared to a vacuum. Another way to control impurities from an ambient atmosphere is to use a guard flow, such as that produced by the device illustrated in FIG. 2.

More generally, embodiments of the invention allow for patterned vapor phase deposition at pressures higher than previously thought possible in a region between a nozzle and a substrate. Specifically, this "region between a nozzle and a substrate" is the region surrounding the jet of carrier gas as it travels from the nozzle to the substrate, which may interact with the jet. One way of controlling the pressure in this region is through the background pressure, which is the pressure in the room, vacuum chamber, or other area in which the deposition is occuring—for example, by depositing in a vacuum chamber. Another way of controlling this pressure is though the use of a guard flow, as illustrated in FIG. 2. A guard flow may be desirable even in a pressure controlled environment such as a vacuum chamber, to mitigate the effect of any impurities that may be present.

"Ambient" as used herein refers to the default state of a parameter, when no effort is made to control that parameter beyond the normal efforts associated with a home or office building. For example, ambient atmosphere is 1 atm (or thereabout depending on elevation) having the general chemical composition of air, and ambient temperature is room temperature, or approximately 25 degrees C. (or thereabout). "Background" pressure is the pressure in a chamber (vacuum or otherwise), measured far from any effects caused, for example, by an OVJP jet.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of depositing a patterned layer of an organic material on a surface of a substrate, comprising:
    mixing vapor of an organic material for deposition with a carrier gas;
    introducing the carrier gas carrying the organic material for deposition into a nozzle;
    ejecting the carrier gas carrying the organic material from the nozzle at a flow velocity that is at least 10% of the thermal velocity of the carrier gas, such that the organic material introduced with the carrier gas into the nozzle is deposited onto a substrate, separated from the nozzle, forming the layer of the organic material on the surface of the substrate, the layer comprising a plurality of separate films; and
    based upon the molecular mass of the carrier gas, the molecular mass of the organic material, the mean free path of the ejected material, or a combination thereof, selecting a separation s between the nozzle and the substrate and a downstream pressure $P_L$ sufficient to create a dynamic pressure surrounding the carrier gas in a region between the nozzle and the substrate of at least 1 Torr.

2. The method of claim 1, wherein the dynamic pressure is at least 10 Torr.

3. The method of claim 2, wherein a background pressure of at least 5 Torr is provided.

4. The method of claim 2, further comprising: providing a guard flow surrounding the ejected material.

5. The method of claim 2, wherein the dynamic pressure of at least 10 Torr is affected by a guard flow surrounding the ejected material.

6. The method of claim 5, wherein the method is performed in a vacuum chamber at base pressure, thereby providing a background pressure of less than about 0.1 Torr.

7. The method of claim 6, wherein the molecular weight of the organic material is greater than the molecular weight of the carrier gas.

8. The method of claim 5, wherein the guard flow comprises a first gas, the carrier gas comprises a second gas, and the molecular weight of the first gas is greater than the molecular weight of the second gas.

9. The method of claim 1, wherein a background pressure of about 760 Torr is provided, and the background pressure is the ambient atmosphere.

10. The method of claim 1, wherein the dynamic pressure is at least about 760 Torr.

11. The method of claim 1, wherein a background pressure of at least about $10^{-3}$ Torr is provided.

12. The method of claim 1, wherein the background pressure is at least 0.1 Torr.

13. The method of claim 12, wherein the background pressure is at least 1 Torr.

14. The method of claim 13, wherein the background pressure is at least 10 Torr.

15. The method of claim 14, wherein the background pressure is at least about 760 Torr.

16. The method of claim 15, wherein the background pressure of at least about 760 Torr is provided by a glove box without the use of a vacuum apparatus.

17. The method of claim 11, wherein the background pressure is achieved without the use of vacuum apparatus.

18. The method of claim 1, wherein the dynamic pressure is not greater than about 2 times the background pressure.

19. The method of claim 1, wherein the dynamic pressure is not greater than about 10 times the background pressure.

20. The method of claim 1, wherein the plurality of separate films comprises a plurality of pixels.

21. The method of claim 1, wherein at least one of the nozzle diameter, the nozzle length, and nozzle-to-substrate separation is about equal to the gas mean free path length.

22. The method of claim 1, wherein the dynamic pressure is at least 0.5 Torr greater than the background pressure.

23. A method of depositing a patterned layer of an organic material on a surface of a substrate, comprising:
    mixing vapor of an organic material for deposition with a carrier gas;
    introducing the carrier gas carrying the organic material for deposition into a nozzle;
    ejecting the carrier gas carrying the organic material from the nozzle at a flow velocity that is at least 10% of the thermal velocity of the carrier gas, such that the organic material introduced with the carrier gas into the nozzle is deposited onto a substrate, separated from the nozzle, to form the patterned layer of organic material, the layer comprising a plurality of separate films on the surface of the substrate; and
    providing a guard flow around the carrier gas.

24. The method of claim 23, wherein the method is performed with a background pressure of at least about 760 Torr.

25. The method of claim 23, wherein the method is performed in a glove-box without the use of a vacuum apparatus.

26. The method of claim 23, wherein the plurality of separate films comprises a plurality of pixels.

27. The method of claim 23, wherein at least one of the nozzle diameter, the nozzle length, and nozzle-to-substrate separation is about equal to the gas mean free path length.

* * * * *